United States Patent
Mirkarimi et al.

[11] Patent Number: 6,011,646
[45] Date of Patent: Jan. 4, 2000

[54] METHOD TO ADJUST MULTILAYER FILM STRESS INDUCED DEFORMATION OF OPTICS

[75] Inventors: Paul B. Mirkarimi, Sunol; Claude Montcalm, Livermore, both of Calif.

[73] Assignee: The Regents of the Unviersity of California, Oakland, Calif.

[21] Appl. No.: 09/027,309

[22] Filed: Feb. 20, 1998

[51] Int. Cl.[7] ............... G02B 5/28; G02B 5/26; G02B 1/10
[52] U.S. Cl. ............ 359/359; 359/584; 359/582
[58] Field of Search ................... 359/359, 584, 359/582, 580

[56] References Cited

U.S. PATENT DOCUMENTS

| | | | |
|---|---|---|---|
| 5,433,988 | 7/1995 | Fukuda et al. | 359/359 |
| 5,841,584 | 11/1998 | Takatani et al. | 359/584 |

OTHER PUBLICATIONS

Kola et al, Appl. Phys. Lett. 60,3120 (1992).
Rosen et al, Nanostruc. Mater. 3, 195 (1993).
Nguyen et al, (Optical Society of America, Washington, D.C., 1994), vol. 23, p. 56.
Nguyen et al, Physics of X–Ray Multilayer Structures (Optical Society of America, Wash. D.C. 1994), vol. 6, p. 102.
Windt et al, J. Appl. Phys. 78, 2423 (1995).
Kassner et al, J. Mat. Sci. 31, 2291 (1996).
Tinone et al, J. Electron Spectrosc. Relat. Phenom. 80, 461 (1996).
Skulina et al, Appl. Optics 34, 3727 (1995).
Stearns et al, Mater. Res. Soc. Symp. Proc., vol. 382, p. 329 (MRS, 1995).

*Primary Examiner*—Jon Henry
*Attorney, Agent, or Firm*—L. E. Carnahan; Daryl S. Grzybicki

[57] ABSTRACT

A buffer-layer located between a substrate and a multilayer for counteracting stress in the multilayer. Depositing a buffer-layer having a stress of sufficient magnitude and opposite in sign reduces or cancels out deformation in the substrate due to the stress in the multilayer. By providing a buffer-layer between the substrate and the multilayer, a tunable, near-zero net stress results, and hence results in little or no deformation of the substrate, such as an optic for an extreme ultraviolet (EUV) lithography tool. Buffer-layers have been deposited, for example, between Mo/Si and Mo/Be multilayer films and their associated substrate reducing significantly the stress, wherein the magnitude of the stress is less than 100 MPa and respectively near-normal incidence (5°) reflectance of over 60% is obtained at 13.4 nm and 11.4 nm. The present invention is applicable to crystalline and non-crystalline materials, and can be used at ambient temperatures.

27 Claims, 5 Drawing Sheets

METHOD TO ADJUST MULTILAYER FILM STRESS INDUCED DEFORMATION OF OPTICS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to multilayer reflective films, particularly to reducing stress in substrates containing multilayer films, and more particularly to depositing a buffer-layer between the substrate and the multilayer films for adjusting the stress or producing near-zero not stress, and hence little or no deformation of the substrate.

Multilayer structures composed of alternating thin layers of materials, such as molybdenum (Mo) and silicon (Si), with vastly different optical properties have proven effective as high-reflectance, near-normal incidence coatings for various applications. The Mo/Si system which has been shown to give a high reflectance (~60%) for certain wavelengths (11–14 nm), is of particular technological importance due to its application to high-resolution, multiple-reflection imaging systems now being developed for projection lithography.

Extreme-ultraviolet (EUV) lithography systems require several precisely figured, low roughness optics coated with reflective multilayers. To obtain sufficient throughput and image quality, these multilayer coatings must simultaneously have high reflectance (R≧65%) and low residual stress ($\sigma \leq 100$ MPa).

There is a strong commercial driving force for increased miniaturization in electronic devices and, hence, an EUV lithography tool has significant commercial potential. The performance of an EUV lithography tool is key to its implementation over other competing technologies, and high film stresses and low EUV reflectances degrade the performance of an EUV lithography tool.

Over the past decade or so, numerous publications describe the dependency of EUV reflectance of Mo/Si multilayer mirrors or optics on their fabrication parameters. However, the number of publications addressing the problem of stress in Mo/Si multilayers designed for high reflectance in the EUV wavelength is relatively small. The later publications describe how the stress of Mo/Si multilayer coatings can be reduced to low levels (<100 MPa) by: 1) post-deposition annealing (see Kola et al, Appl. Phys. Lett. 60,3120 (1992) and Kassner et al, J. Mat. Sci. 31, 2291 (1996); 2) variation of the Mo to Si ratio (see Nguyen et al, in Physics of X-Ray Multilayer Structures, Optical Society of America, Washington, DC., 1994, Vol. 6, P. 103; Windt et al, J. Appl. Phys. 78,2433 (1995); and Tinone et al, J. Electron Specrosc. Relat. Phenom, 80,461 (1996); and 3) adjustment of the sputter deposition process such as base pressure or target power (see Windt et al and Tinone et al above). Non-thermal or a thermal processes such as 1) and 2) above may be particularly valuable since it is not currently known if a several hundred degree Celcius annealing process is compatible with the EUV optics/substrates, holder assembly, etc. However, none of these prior efforts involve the fabrication of a high near-normal incidence reflectance (≧65%) Mo/Si multilayer coating with a low stress (<100 MPa). No EUV reflection data was shown, except in the above-cited reference Kola et al, where reflectances around 58% were measured, which is significantly lower than 65%, which is necessary for use in EUV lithography, and in Windt et al which showed a reflectance data for a stress reduction from −440 MPa to −280 MPa with a reflectance of 62%.

At this time there has been little work on Mo/Be multilayers (see Skulina et al, Appl. Optics, 34,3727, 1995 and Stearns et al, in Mater. Res. Soc. Symp. Proc. Vol. 382, p. 329, (MRS, 1995), and the stress problem was neither identified nor addressed. High EUV reflectance Mo/Be films have a net tensile stress, and post-deposition annealing processes are not effective in reducing the stress in these films.

An optic (substrate) will deform when a stressed multilayer film is deposited upon it. A viable EUV lithography process will rely on Mo/Si or Mo/Be multilayer films to efficiently reflect light in the 11–14 nm region. Mo/Si and Mo/Be films with high reflectances (>60%) have large film stresses (>400 and >330 MPa respectively), which will deform the optic and potentially degrade the performance of an EUV lithography tool. Thus, there is a need for reducing the stress in the multilayer films without adversely effecting the reflectance of these films. Reflectance is important since the throughput of an EUV lithography system is expected to scale as reflectance.

The present invention provides a non-thermal or athermal approach to producing multilayer reflective films or coatings with high reflectance (>60%) and low stress (<100 MPa), which are particularly applicable for use in an EUV lithography system, for example. The present invention utilizes a buffer-layer between the multilayer film and a substrate.

Buffer layers have been used to tailor the lattice mismatch between layers in epitaxial semiconductor systems, which affect the stress/strain of the overlying thin film; and particular buffer layers have been selected in part because of suitable thermal expansion coefficient value, which can reduce the stress in certain (non periodic) layered film structures that are deposited at elevated temperatures for microelectronic applications. U.S. Pat. Nos. 4,935,385; No. 5,010,375; No. 5,021,360/ No. 5,128,749; No. 5,393,993; No. 5,457,067; and No. 5,523,587 exemplify the prior utilization of buffer layers for epitaxial and/or thermal expansion properties. There has been no prior effort to reduce stress by use of a buffer layer having a sign opposite that of the layers deposited thereon to cancel out the stress.

The present invention involves the use of a buffer-layer between the substrate and the multilayer film, where the buffer-layer is smooth (<0.3 nm rms roughness) and has a stress of sufficient magnitude and opposite in sign to cancel out deformation due to the stress in the multilayer, so as to result in a tunable, adjustable, or near-zero net film stress, and hence result in little or no deformation of the optic or substrate. For example, the magnitude of stress in a multilayer film of +350 MPa is negated by a buffer-layer film having a stress of about −350 MPa, producing a near-zero stress. The invention provides an a thermal or non-thermal method for reducing the stress without a large degradation in reflectance.

SUMMARY OF THE INVENTION

It is an object of the present invention to provide a substrate with a reflective multilayer having near-zero stress.

A further object of the invention is to reduce the stress produced by depositing a multilayer film on a substrate.

A further object of the invention is to provide a high reflectance-low stress multilayer reflective coating on a substrate.

A further object of the invention is to provide a buffer-layer between a substrate and a multilayer for reducing stress with minimal effect on the reflectance of the multilayer.

Another object of the invention is to provide a substrate with, for example, Mo/Si or Mo/Be reflective multilayer coatings having a reflectance of greater than 60% and a stress of less than 100 MPa.

Another object of the invention is to reduce or negate multilayer film stress induced deformation of optics.

Another object of the invention is to provide a method whereby stress in reflective multilayer coatings can be adjusted.

Another object of the invention is to provide a substrate with a low stress reflective multilayer coating by depositing a buffer-layer film between the substrate and the reflective multilayer, such that stress in the buffer-layer reduces or negates the stress in the reflective multilayer.

Another object of the invention is to provide high reflectance-low stress Mo/Si or Mo/Be multilayer films by depositing a buffer-layer between the multilayer films and the substrates (optics) which has a stress of opposite sign to that of the multilayer films to cancel out deformation of the substrate due to the stress in the multilayer film.

Another object of the invention is to produce Mo/Si and Mo/Be multilayer films having a near-normal incidence reflectance greater than 60% and a stress of not greater than 100 MPa, and which are compatible for use in EUV lithography tools.

Another object of the invention is to produce multilayer films having a near-normal incidence reflectance of greater than 65% and a stress of not greater magnitude than 30 MPa.

Other objects and advantages of the present invention will become apparent form the following description and accompanying drawings. The invention basically involves positioning a buffer-layer between a substrate and a multilayer film, wherein the buffer-layer is smooth (less than 0.3 nm rms roughness) and has a stress of sufficient magnitude and opposite in sign to cancel out deformation due to the stress in the multilayer film. This results in a tunable, near-zero net film stress, and hence results in little or no deformation of the substrate. Note that this invention enables the net stress/curvature to be tuned to zero or adjusted to some other desired value without the need to vary the processing conditions of the optimized, high EUV reflectance multilayer.

The present invention enables the production of both Mo/Si and Mo/Be high reflectance-low stress multilayer films. For example, a reflective multilayer film composed of Mo/Si with a buffer-layer of film composed of Mo/Be, were deposited on an Si (100) substrate. The net stress of the combined films was only −28 MPa, with a reflectance of 66.5% at a wavelength of 13.33 nm (measured 5° from normal incidence). In another example, Mo/Si buffer-layers with a high Mo fraction were deposited underneath reflectance-optimized Mo/Si films, and tests thereon confirmed that the net stress/curvature of the Mo/Si film combination can be tuned through zero by varying the thickness and Mo fraction of the buffer-layer. A 270 nm thick Mo/Si film with a period of 6.9 nm and a Mo fraction of 0.4 was deposited upon a similar film with a Mo fraction of 0.8, and yielded a film with a net stress of −70 MPa (a reduction of 350 MPa). Reflectively measurements yielded a peak reflectance at 5° from normal of about 63% at 13.4 nm with a FWHM of 0.55 nm.

The present invention has the potential to impact the performance of EUV lithography systems currently under development which, in turn, can have a significant impact on the further miniaturization of electronic devices. This invention will also impact any technology where stress in optical coatings is an issue, such as in the National Ignition Facility, as well as in applications involving soft x-ray and EUV wavelength regions.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The present invention is directed to a method to reduce or negate multilayer film stress induced deformation of optics (substrates). The technique of the present invention involves a buffer-layer intermediate the substrate and the multilayer. As pointed out above, an optic (substrate) will deform when a stressed multilayer film is deposited upon it. Mo/Si and Mo/Be multilayer films with good reflectances (>60%) have large film stresses (>400 and >330 MPa respectively). Thus, conventionally fabricated Mo/Si or Mo/Be multilayers deposited directly on substrates are not desirable candidates for use in a EUV lithography process which rely on optics using multilayer films to effectively reflect light in the 11–14 nm region, because the high stress of the multilayers alters the very accurate figure specifications.

The present invention provides multilayer reflective films having high reflectance and low stress, thereby providing a viable multilayer for the several optics of a EUV lithography system. By providing a buffer-layer intermediate the substrate (optic) and the reflective multilayer, the magnitude of the stress is reduced to under 100 MPa with minimal (near zero to 1.5%) loss in reflectance. Recent efforts utilizing the present invention have established that the magnitude of the stress of less than 30 MPa with a minimal loss of less than 1% in reflectance can be obtained. The buffer-layer must be very smooth (less than 0.3 nm rms roughness) and have a stress of sufficient magnitude and opposite in sign to cancel out or greatly reduce deformation in the optic (substrate) due to the stress in the multilayer. It is desirable to produce a multilayer with stress of under 30 MPa and a smoothness of below 0.3 nm rms. Thus, by use of the buffer-layer, a stress of 400 MPa, for example, can be reduced to less than 100 MPa, preferably to less than 30 MPa. This invention enables a tunable, near-zero net film stress, or enables adjusting the stress, and hence results in little or no deformation of the optic (substrate). Note that the technique of the present invention (the use of a buffer-layer) enables the net stress/curvature to be tuned to zero without the need to vary the processing conditions of the optimized, high reflectance multilayer. Note also that this invention does not require that any of the films (or layers) be epitaxial, or even crystalline, and thus the film growth can be done at any temperature (including ambient).

While the following examples utilize Mo/Si and Mo/Be multilayers, other molybdenum containing materials may be utilized for the multilayers, such as Mo/Y, $Mo_2C/Si$, $Mo_2C/Be$, Mo/C, and Mo/Sr. Also, $Mo_2C/Si$, $Mo_2C/Be$, and a-C, or other material which is opposite in stress to the multilayer stress and is very smooth, can be used as the buffer layer.

Figure 1:
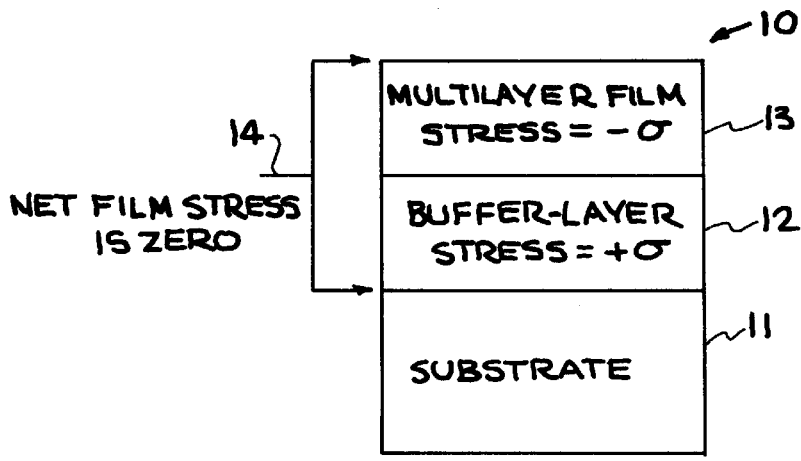
FIG. 1 schematically illustrates the athermal or non-thermal (buffer-layer) approach to stress reduction in accordance with the present invention.

Referring now to the drawings, FIG. 1 schematically illustrates the invention, wherein a reflective device indicated at 10 comprises a substrate (optic) 11, a buffer-layer 12, and a multilayer film 13. The substrate 11 may be composed of silicon, low thermal expansion glass, ceramics such as Zerodur or ULE or Zerodur M, quartz, float glass, and sapphire. The buffer-layer 12, as shown, has a positive stress while the multilayer film 13 has a negative stress, depending on the application, such that the net film stress is zero, as indicated at 14. Here, the positive stress in the buffer-layer 12 equals the negative stress in the multilayer film 13, but the stresses need not be equal, but preferably near equal, and such can be tuned, for example, by the composition of the buffer-layer 12, as discussed in greater detail hereinafter. Alternatively, depending on the composition of the multilayer film 13, the stress thereof may be positive and thus the stress in the buffer-layer 12 must be designed to be negative, to provide the desired near-zero net film stress.

The buffer-layer approach to stress reduction, as illustrated in FIG. 1, provides the potential to tailor the net film stress (curvature) to any desired level. There are certain boundary conditions: 1) the buffer-layer must be smooth, and 2) the combined multilayer/buffer layer/substrate must be stable over time. Also, in certain applications, the non-spherical component of the stress/curvature should also decrease. The buffer-layer may be a multilayer, a composite, or a single layer depending on the compositions of the multilayer film and the buffer-layer.

Figure 2:
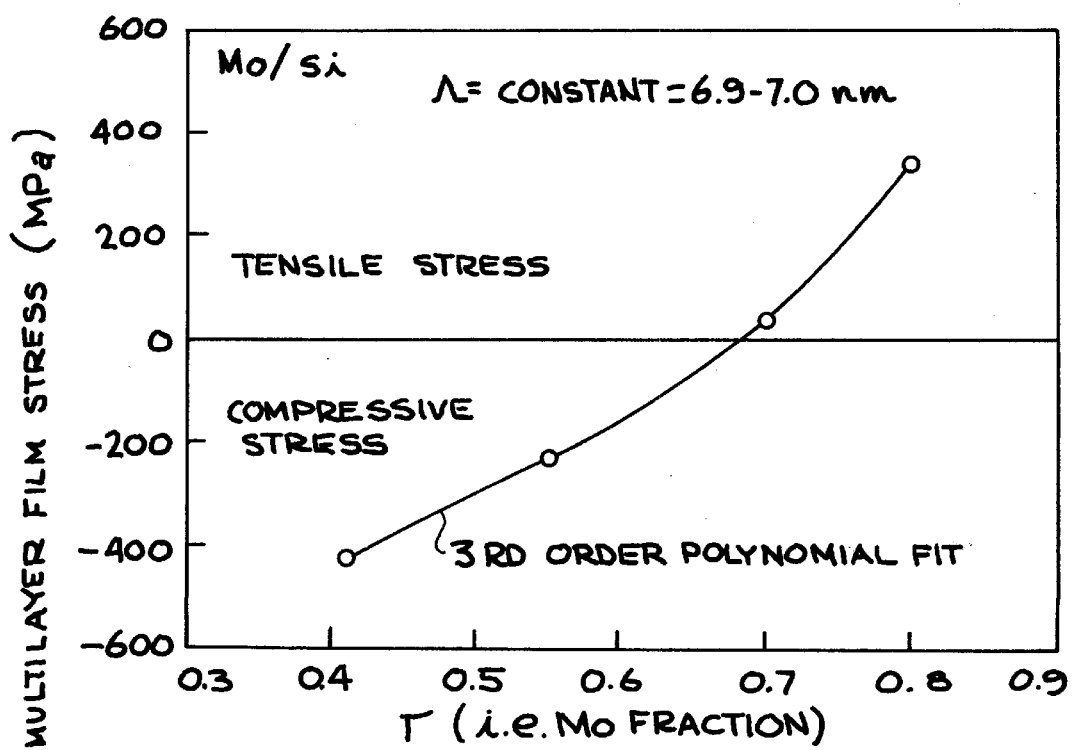
FIG. 2 graphically illustrates that the Mo/Si multilayer film stress is a function of the Mo fraction in the multilayer.

FIG. 2 illustrates that the multilayer film stress is a function of the Mo fraction (Mo to Si ratio) in an Mo/Si multilayer film, wherein the constant ($\Lambda$) equals 6.9–7.0 nm. Thus, the stress of the Mo/Si multilayer film can be tuned by adjusting the Mo fraction. Also, the graph of FIG. 2 illustrates a non-linear behavior as a result of increasing the Mo fraction.

Figure 3:
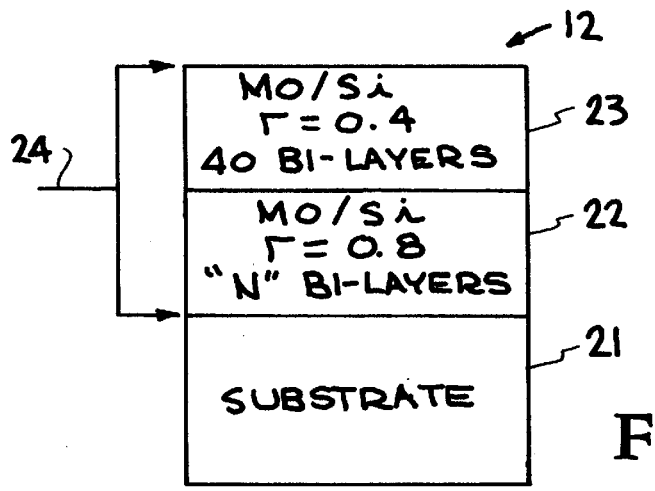
FIG. 3 schematically illustrates a Mo/Si multilayer with an Mo/Si buffer-layer of a different Mo fraction.

FIG. 3 schematically illustrates a simples method for reducing, tuning, or adjusting stress in a Mo/Si multilayer in accordance with the invention, which involves employing a Mo/Si buffer-layer. As shown, the device 20 comprises a substrate (optic) 21, which may be silicon, a buffer-layer 22 of Mo/Si, and a multilayer film 23 of Mo/Si. The multilayer film 23 is composed of 40 bi-layers having a Mo fraction ($\gamma$) of 0.4, and a stress of –420 MPa. The buffer-layer 22 is composed of "N" bi-layers, in this example N=40, having a Mo fraction ($\gamma$) of 0.8, and a stress of +340 MPa. Experimental results established that the net film stress, indicated at 24, where N=40, stress =–70 MPa (compressive), and where N=48, stress =+200 MPa (tensile). This confirms that the net stress 24 can be tuned or adjusted by the number of bi-layers (or the thicknesses or individual layers) in the Mo/Si buffer-layer 22, where the Mo fraction in the buffer-layer differs from the Mo fraction in the Mo/Si multilayer film 23. Thus, the stress can be adjusted to satisfy applications where stress is desired.

Figure 4:
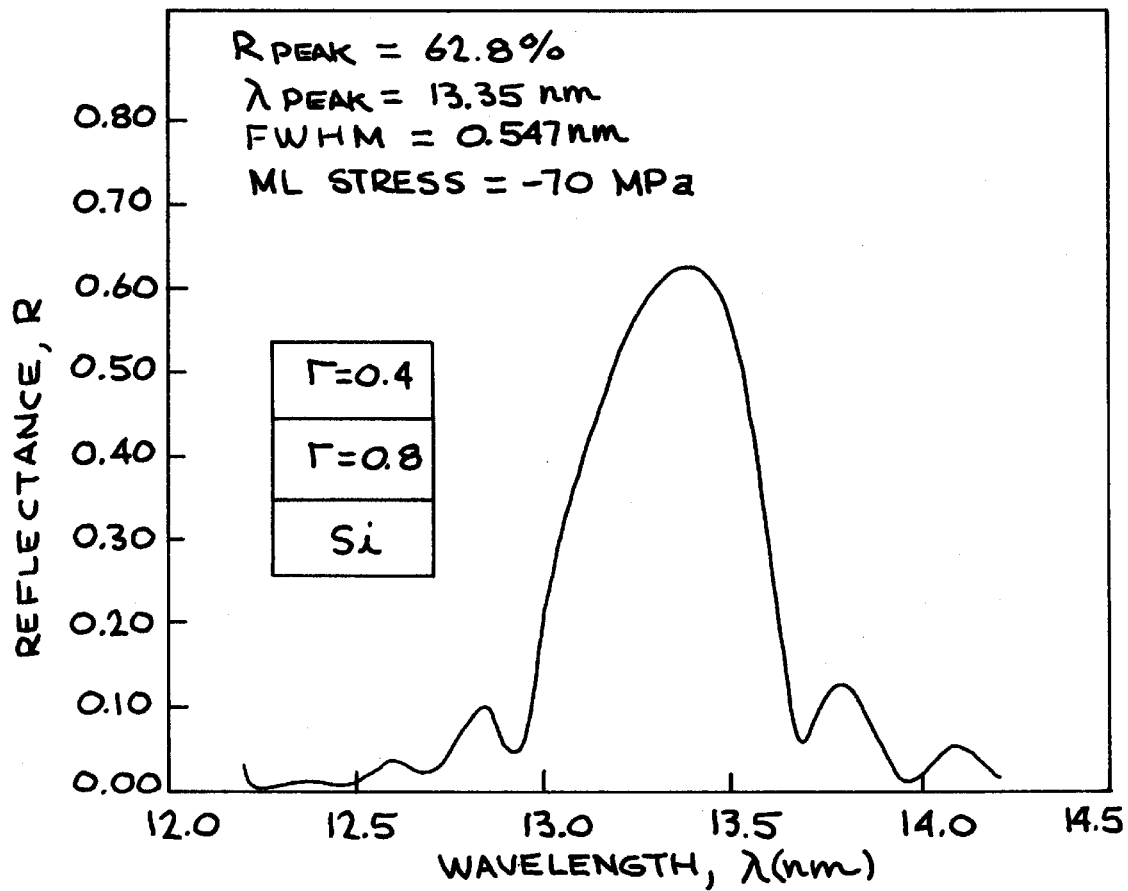
FIG. 4 graphically illustrates reflectance measurements of an Mo/Si multilayer with an Mo/Si buffer layer, as in FIG. 3.

FIG. 4 graphically illustrates the reflectance measurements of a Mo/Si multilayer film with a Mo fraction of 0.4 (40%), with a Mo/Si buffer-layer with a Mo fraction of 0.8 (80%), on a silicon (Si) substrate. The peak reflectance (R peak) equaled 62.8%, at a wavelength of 113.35 nm measured at 5° from normal incidence, results in a net multilayer (ML) stress equal to –70 MPa and a 3–4% loss in reflectance compared to that of the non-buffered Mo/Si multilayer.

Figure 5:
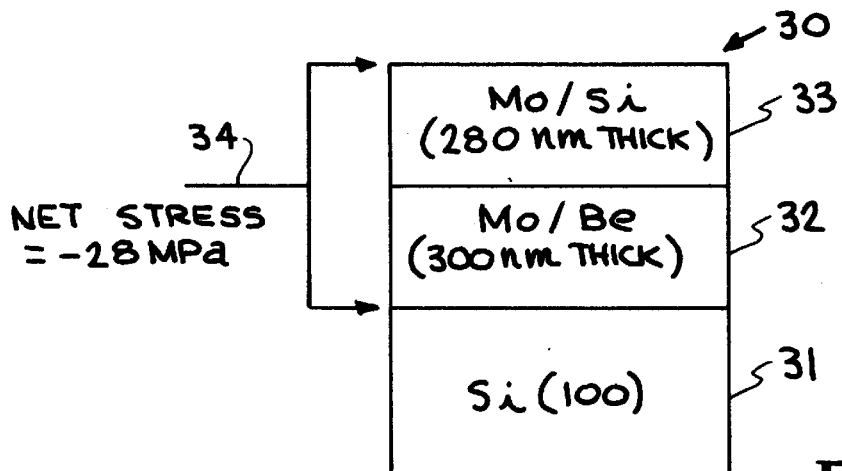
FIG. 5 schematically illustrates a preferred embodiment wherein the buffer-layer method of the present invention is applied to an Mo/Si multilayer using a Mo/Be buffer-layer on a silicon substrate.

FIG. 5 schematically illustrates a preferred embodiment of the invention with the reflective multilayer film composed of Mo/Si and the buffer-layer composed of Mo/Be, on a Si (100) substrate. As shown, the device indicated at 30 has a substrate 31 of Si 100, a Mo/Be buffer-layer 32 having a thickness of 300 nm, and a Mo/Si multilayer film 33 having a thickness of 280 nm, which produced a net stress indicated at 34 equal to –28 MPa, with <1% reduction in reflectance compared to a non-buffered multilayer coating. Thus, the buffer-layer technique of this invention can be successfully applied to the Mo/Si system by using a Mo/Be buffer-layer. The thickness of the Mo/Be buffer layer (or individual layers) can be tailored to reduce or negate the stress of the Mo/Si multilayer film with minimal reflectance loss.

Figure 6:
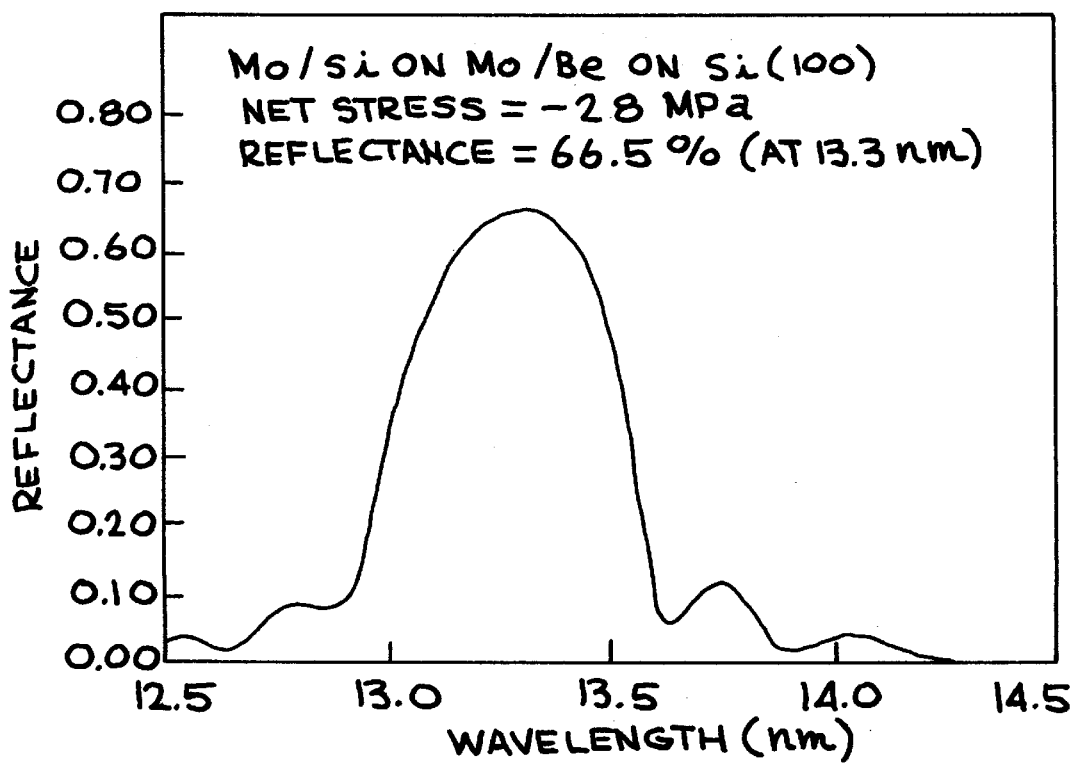
FIG. 6 graphically illustrates reflectance measurements of a Mo/Si multilayer deposited on a Mo/Be buffer-layer, as in FIG. 5.

A Mo/Be buffer layer with 53 bi-layers and a bi-layer thickness of approximately 5.8 nm was deposited on a silicon (100) substrate, and then a 40 bi-layer, high reflectance Mo/Si film with a bi-layer thickness of 6.9 nm was deposited upon the Mo/Be buffer-layer. The net stress of the combined films was only –28 MPa, and yielded a peak reflectance of 66.5% at a wavelength of 13.33 nm (5° from normal incidence), as shown in FIG. 6. During the same experimental run, a Mo/Si multilayer as described above was deposited directly on a Si (100) wafer; the stress was 440 MPa and the reflectance was 67.4% at a 5° from normal incidence wavelength of 13.38 nm. Thus it is possible to reduce the stress to near zero levels with a <1% decrease in reflectivity using the appropriate buffer-layer.

Figure 7:
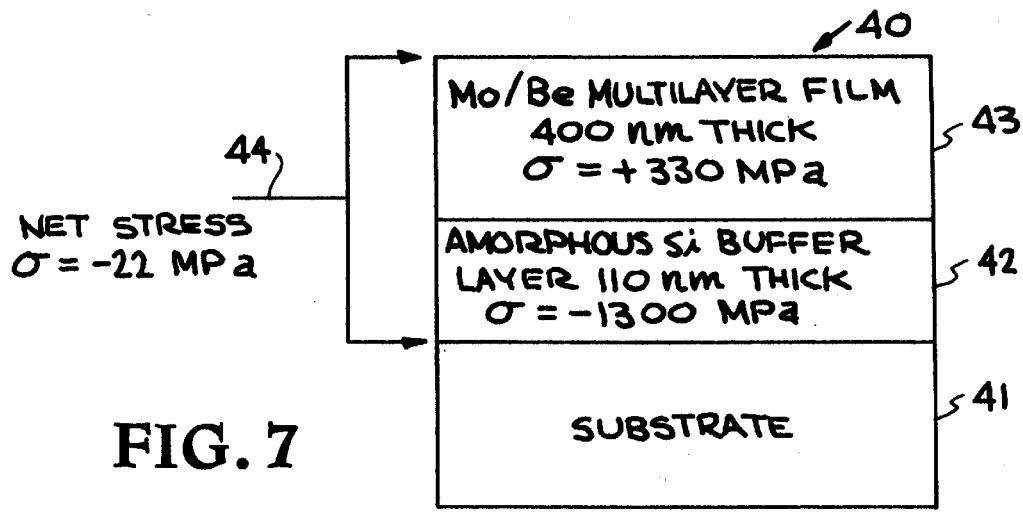
FIG. 7 schematically illustrates the non-thermal stress compensation technique of the present invention applied to a Mo/Be multilayer using an amorphous silicon buffer-layer.
Figure 8:
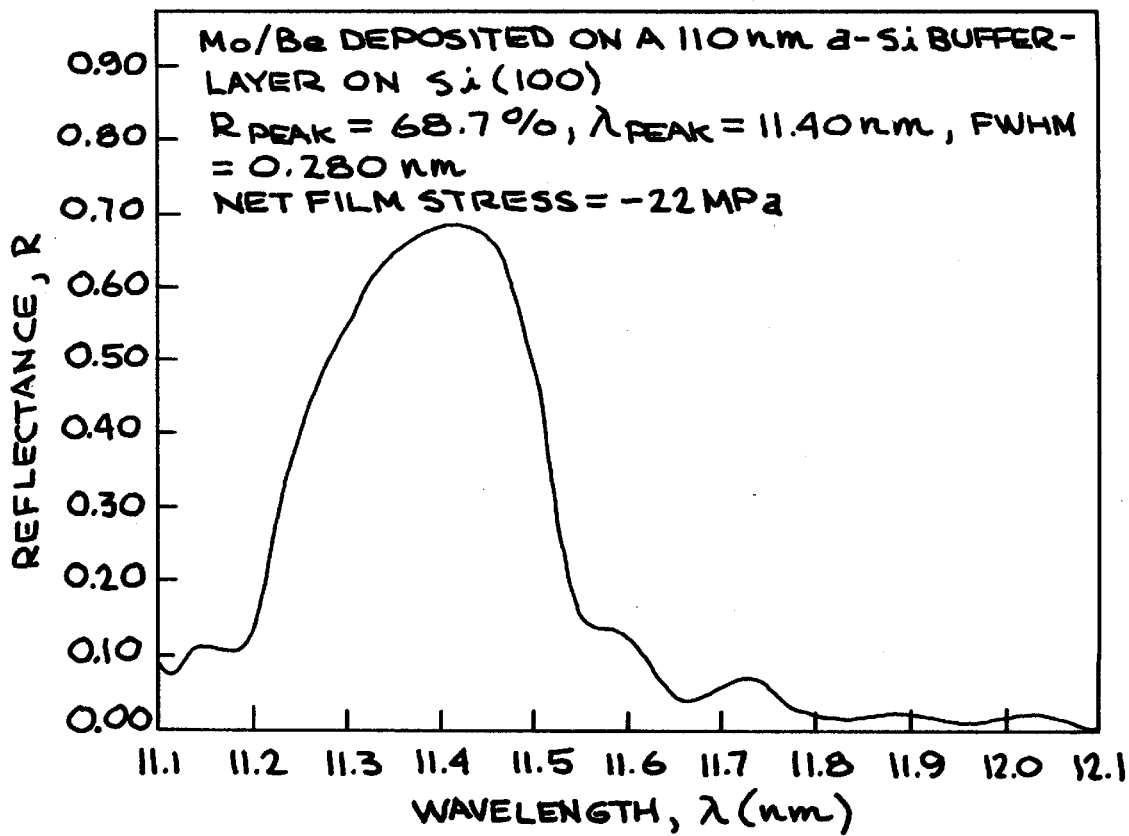
FIG. 8 graphically illustrates reflectance measurements of an Mo/Be multilayer deposited on an amorphous silicon buffer-layer on a silicon substrate, as in FIG. 7.

FIG. 7 schematically illustrates an embodiment of a non-thermal stress compensation technique in accordance with the present invention that has been successfully demonstrated for a Mo/Be multilayer system. It has not been demonstrated that this technique can be used to reduce or negate the multilayer film stress induced deformation of substrates (optics) for Mo/Be multilayer films as well as Mo/Si multilayer films. The embodiment of FIG. 8 comprises a device generally indicated at 40 composed of a substrate 41, a buffer layer 42, and a Mo/Be multilayer film 43. The buffer-layer 42 was formed of amorphous silicon deposited at room temperature by making 33 passes of the silicon substrate 41 over a silicon sputtering target. The total amorphous silicon (a-Si) film thickness was 110 nm, and the film stress was approximately –1300 MPa (compressive). Then a 400 nm Mo/Be multilayer film 43 was deposited upon the a-Si buffer layer film 42, and the net film stress, indicated at 44, was a low –22 MPa (compressive). During the same deposition run, another Mo/Be multilayer was deposited (under identical conditions) on a silicon substrate with no a-Si buffer-layer, and the film stress was rather high, 3332 MPa (tensile). Reflectance measurements made using a synchrotron source showed that the Mo/Be film deposited upon the a-Si buffer-layer had a reflectance of 68.7% at a wavelength of 11.4 nm at 5° from normal incidence. A plot of the measurements is graphically illustrated in FIG. 8. In comparison, the control sample (the Mo/Be deposited directly on the silicon substrate) had a reflectance of 69.5% at a wavelength of 11.42 nm. Thus the significant reduction in the magnitude of stress using an a-Si buffer-layer resulted in a minimal loss of 0.8% in reflectance. The buffer-layer can be varied in thickness to adjust the magnitude of stress in the multilayers.

Figure 9:
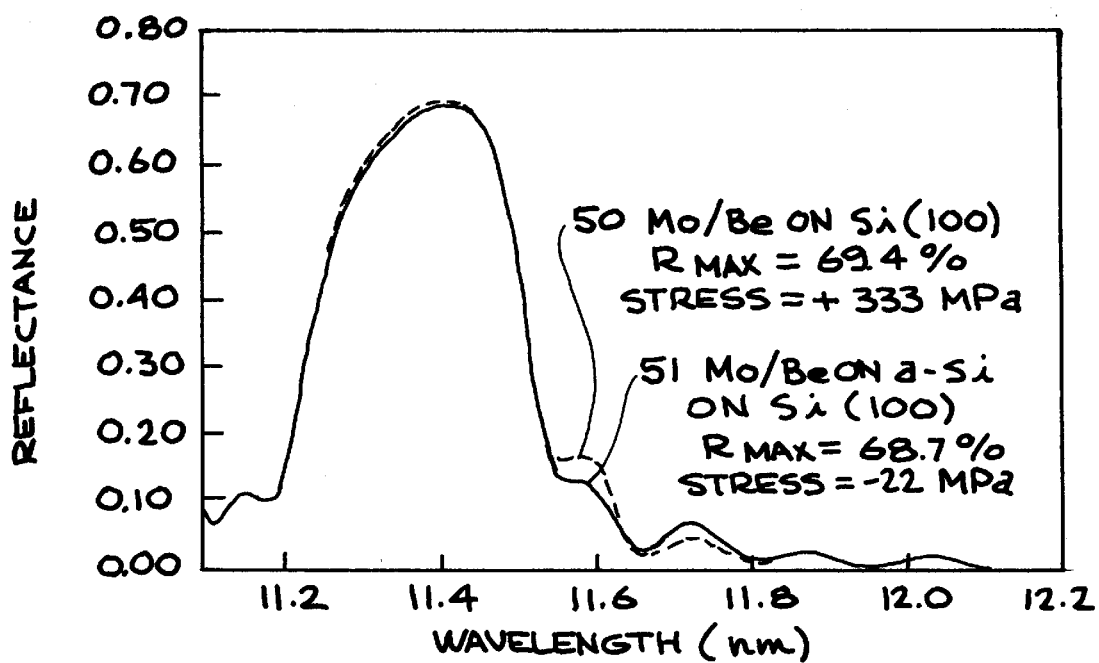
FIG. 9 graphically illustrates reflectance measurements of a Mo/Be multilayer deposited on Si (100) substrate with and without a buffer-layer.

FIG. 9 illustrates multilayers of Mo/Be with and without a buffer-layer, which were deposited during the same experimental or deposition run. As indicated by arrow 50, Mo/Be multilayers were deposited on an Si (100) substrate, and having an Rmax of 69.4% and a stress of +333 MPa. As indicated by arrow 51, Mo/Be multilayers were deposited on an a-Si buffer-layer deposited on an Si (100) substrate, which resulted in an Rmax of 68.7% and a stress of −22 MPa. Thus, by use of the buffer-layer, the stress was reduced from +333 MPa to −22 MPa, with only a 0.7% reduction or loss in reflectance.

The present invention is applicable to crystalline and non-crystalline materials, and can be used at ambient temperatures. Also, the invention enables adjusting the stress by increasing the thickness of the buffer layer, provided it is not increased to a point where reflectance loss results.

It has thus been shown that the present invention provides a non-thermal buffer-layer technique that can be used to reduce the multilayer film stress-induced curvature of substrates (optics) to near zero levels while still maintaining a high reflectivity in the extreme ultraviolet (EUV) wavelength region. The composition, thickness, etc. of the buffer-layers can be turned to negate the stress in the multilayer film. While the description has been directed to Mo/Si and Mo/Be multilayer films, the buffer-layer approach can be successfully utilized to reduce stress in other multilayer systems.

While the invention provides reduced stress multilayer films which have particular application in EUV lithography system, such can have significant impact on miniaturization of electronic devices, as well as being useful in any application requiring high reflectance-low stress optical coating, such as in the soft x-ray and EUV wavelength regions for applications in x-ray research, x-ray spectroscopy, x-ray microscopy, x-ray astronomy, and synchrotron optics.

While particular embodiments, materials, parameters, etc. have been set forth to exemplify and teach the principles of the invention, such are not intended to be limiting. Modifications and changes may become apparent to those skilled in the art, and it is intended that the invention be limited only by the scope of the appended claims.

What is claimed is:

1. In a device including a multilayer of high reflectance material and a substrate, the improvement comprising:
   means for adjusting or reducing the magnitude of stress in the multilayer with less than 5% reduction in reflectively comprising a buffer-layer located intermediate the multilayer and the substrate, the buffer-layer being composed of material having different stress characteristics than the multilayer material.

2. The improvement of claim 1, wherein the magnitude of stress is less than about 100 MPa.

3. The improvement of claim 1, wherein said buffer-layer has a stress of sufficient magnitude and opposite in sign to the stress of said multilayer to cancel stress in the multilayer.

4. The improvement of claim 1, wherein said multilayer is selected from the group consisting of Mo/Si, Mo/Be, Mo/Y, $Mo_2C/Si$, Mo/C, Mo/Sr, and $Mo_2C/Be$ multilayers.

5. The improvement of claim 1, wherein said buffer-layer is composed of one of Mo/Si, Mo/Be, $Mo_2C/Si$, $Mo_2C/Be$, a-Si, and a-C.

6. The improvement of claim 1, wherein said buffer-layer is composed of Mo/Si or Mo/Be, and wherein said multilayer is composed of Mo/Si.

7. The improvement of claim 1, wherein said buffer-layer is composed of a-Si, and wherein said multilayer is composed of either Mo/Be or Mo/Si.

8. The improvement of claim 1, wherein said buffer-layer and said multilayer are composed of Mo/Si, with the Mo/Si buffer-layer having a different Mo fraction than the Mo fraction in the multilayer.

9. The improvement of claim 1, wherein the Mo fraction in said buffer-layer is about 0.4 and said Mo fraction in said multilayer is about 0.8.

10. The improvement of claim 9, wherein the stress is adjusted by the Mo fraction in either multilayer or the buffer-layer.

11. A method for reducing or negating multilayer film stress induced deformation of optics, comprising:
    providing an optic,
    forming a buffer layer on the optic, and
    forming a multilayer film on the buffer-layer, the multilayer film having different stress characteristics than the buffer-layer.

12. The method of claim 11, wherein the buffer-layer is formed to provide a surface having less than 0.3 nm rms roughness.

13. The method of claim 11, wherein the buffer-layer is formed to have a stress of a magnitude and opposite in sign to cancel out deformation due to the stress in the multilayer.

14. The method of claim 11, wherein the buffer-layer is tunable to enable near-zero net stress so as to produce little or no deformation of the optic.

15. The method of claim 11, additionally including forming the optic.

16. The method of claim 11, wherein the optic is composed of material selected from the group, consisting of silicon, low thermal expansion glass-ceramics, quartz, float glass, ultra-low thermal expansion glass, and sapphire.

17. The method of claim 11, wherein the multilayer is formed of material selected from the group consisting of Mo/Si, Mo/Be, $Mo_2C/Si$, and $Mo_2C/Be$.

18. The method of claim 11, wherein the buffer-layer is formed of material selected from the group consisting of MoSi, Mo/Be, a-Si, $Mo_2C/Si$, $Mo_2C/Be$, and A-C.

19. The method of claim 11, wherein the buffer-layer and the multilayer are each formed from Mo/Si, and wherein the Mo/Si buffer-layer has a different Mo fraction than the Mo fraction in the Mo/Si multilayer.

20. The method of claim 11, wherein the multilayer is formed of Mo/Si, and wherein the buffer-layer is formed of Mo/Si or Mo/Be.

21. The method of claim 11, wherein the multilayer is formed of Mo/Be, and wherein the buffer-layer is formed of a-Si.

22. The method of claim 11, wherein the buffer-layer is adjustable in stress by increasing or decreasing the thickness thereof.

23. In an optic adapted for use in an extreme ultraviolet lithography tool and having a high reflectance multilayer, the improvement comprising:

a buffer-layer positioned between the optic and the multilayer and constructed to at least reduce deformation of the optic due to stress in the multilayer, said buffer-layer having different stress characteristics than said multilayer.

24. The improvement of claim 23, wherein said buffer-layer is smooth and has a stress of sufficient magnitude and opposite in sign to cancel out deformation due to the stress in the multilayer.

25. The improvement of claim 23, wherein said buffer-layer is selected from the group of material consisting of Mo/Si, Mo/Be, Mo$_2$C/Si, Mo$_2$C/Be, a-Si, and a-C, and wherein said multilayer is composed of material selected from the group consisting of Mo/Si, Mo/Be, Mo/Y, Mo$_2$C/Si, Mo/Sr, Mo/C, and Mo$_2$C/Be.

26. A method for adjusting stress in a molybdenum containing multilayer of high reflectance material deposited on a substrate, including:
   forming a molybdenum containing buffer-layer intermediate the multilayer and the substrate the buffer-layer having different stress characteristics than the multilayer; and
   controlling the stress in the multilayer by adjusting the molybdenum fraction in at least one of the multilayers and the buffer-layer.

27. The method of claim 26, wherein the molybdenum containing multilayer and buffer-layer are composed of molybdenum and silicon.

* * * * *